United States Patent [19]
Tran et al.

[11] Patent Number: 5,963,652
[45] Date of Patent: Oct. 5, 1999

[54] CONTROLLING MULTIMEDIA ASPECTS OF A COMPUTER

[75] Inventors: Thanh T. Tran; Gokalp Bayramoglu, both of Houston; William H. Nott, Spring; Hiten N. Dalal, Cypress; Conrad M. Allen, Jr., Houston, all of Tex.

[73] Assignee: Compaq Computer Corporation, Houston, Tex.

[21] Appl. No.: 08/667,582

[22] Filed: Jul. 12, 1996

[51] Int. Cl.[6] .................................................. H03G 3/00
[52] U.S. Cl. ............................................ 381/109; 381/306
[58] Field of Search .................................... 381/24, 1, 87, 381/88, 90, 188, 205, 109, 104, 306, 332, 333

[56] References Cited

PUBLICATIONS

"Windows 3.1" pp. 519–522, 1992.
Sound Minds Technology Inc., "Twin Sound", 1992.
Wall Street Journal 3 Start, Eastern Edition, "Clunky, Chunky Computers Get Sleek New Physiques", Oct. 17, 1995.
Compaq, COMPAQ PAQRAP Special Edition Brochure, Entitled "Introducing The Presario PCs That Put More Power At Your Fingertips", pp. 1–6, Summer 1996, USA.

Compaq, Compaq Presario Personal Computers Brochure, p. 27, USA.

Compaq, Compaq Presario 4402 Brochure, QUICKSPECS, No. 063B/0596, USA.

Compaq, Compaq Presario 4402 Brochure, Doc. No. 147A/0896, USA.

*Primary Examiner*—Ping Lee
*Attorney, Agent, or Firm*—Jenkens & Gilchrist P.C.

[57] ABSTRACT

A computer system has a speaker, a unit having a central processor, a monitor separate from the unit, a video cable connecting the unit to the monitor, and a volume control for the speaker, the volume control being mounted in the monitor. Circuitry in the unit responds to the volume control by adjusting the volume output of the speaker.

10 Claims, 16 Drawing Sheets

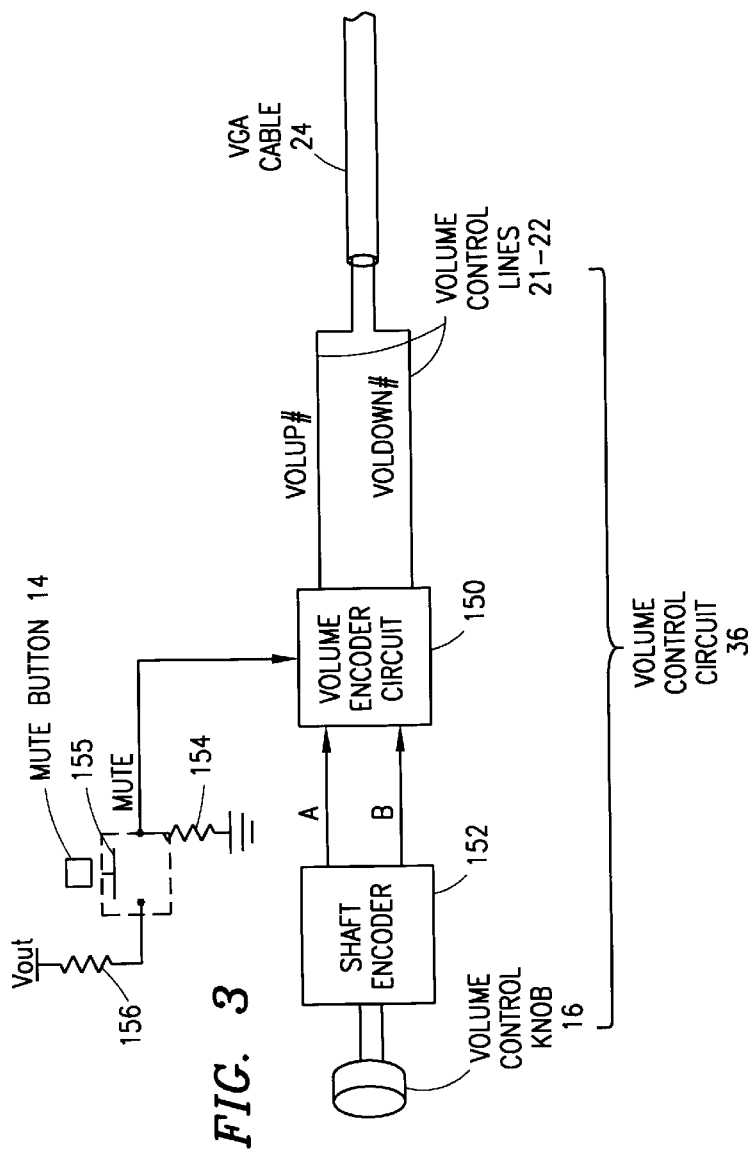
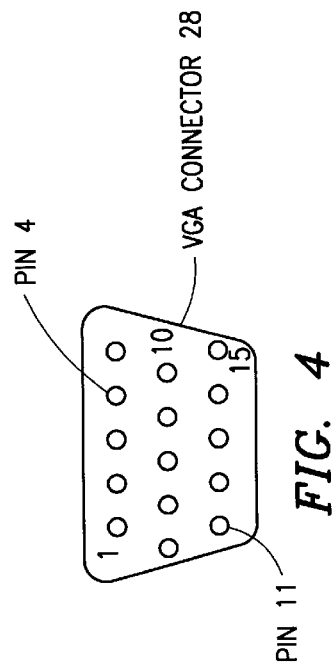
FIG. 3
FIG. 4

CONTROLLING MULTIMEDIA ASPECTS OF A COMPUTER

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates to controlling multimedia aspects of a computer.

A typical computer system has software applications that process and generate data used in multimedia aspects (e.g., sound or video) of the computer system. For example, as part of a speakerphone emulation, data received via a modem may be converted into sound via audio speakers, and data received via a microphone may be processed and transmitted via the modem over a telephone line. As another example, video data received via a telephone line or a CD-ROM may be displayed on a monitor.

For furnishing sound, a plug-in sound card or a board mounted chip typically furnishes an interface between sound data generated by software and the speakers. The sound circuit may have a digital signal processor used to sample an analog input furnished by a microphone. Because the sound data is represented in a digital format, the sound circuit typically has a digital-to-analog (D/A) converter used to convert the sound data into an analog representation furnished to the speakers. Software of the computer system can typically program the sound chip to set the magnitude of the analog representation and thus, the volume level of sound emanating from the speakers.

SUMMARY

In general, in one aspect, the invention features apparatus for controlling a level of an audible characteristic of a sound delivered by a sound generating device associated with a computer. The apparatus includes sound circuitry having an audio output connected to deliver audio signals to drive the sound generating device. A control is configured to permit a user to indicate a desired level of the audible characteristic. A multiple line video cable has lines connecting a video controller of the computer with a video display device. The sound circuitry is connected at one end of at least one line of the video cable and the user control is connected at another end of the at least one line of the video cable to enable the control to communicate with the sound circuitry.

Implementations of the invention may include one or more of the following features. The control and the sound circuitry includes an encoder and a decoder that encode and decode information about the desired level of the audible characteristic. The control includes a mechanism for registering an amount of relative increase or decrease in the desired level. The audible characteristic is volume. The control includes a device to register muting as the desired level. In some examples, there are exactly two lines of the video cable that connect the sound circuitry to the control. The control includes a manually rotatable element and a shaft encoder associated with the element. The manually rotatable element is rotatable without stopping in either direction. The cable is a VGA cable and the display device is a VGA-compatible monitor. The control includes a push button device.

In general, in another aspect, the invention features such an apparatus in which the sound circuitry includes storage for a value indicative of the level of the audible characteristic that the sound circuitry is set to deliver, the stored value being accessible to other devices of the computer. An electromechanical control is configured to permit a user to indicate desired discrete increments in the level of the audible characteristic, the control including a motion encoder which outputs a signal corresponding to the desired discrete increments. The sound circuitry responds to the output signal of the encoder to change the stored value indicative of the desired level of the audible characteristic.

Implementations of the invention may include one or more of the following features. The discrete increments include increases and decreases in the volume. The electromechanical control includes a rotatable element and the encoder comprises a shaft angle encoder.

In general, in another aspect, the invention features such an apparatus in which the discrete value is updatable in storage no faster than at a first update rate. The control permits a user to indicate desired discrete increments in the level of the audible characteristic, the increments being indicated at a second update rate faster than the first update rate. A buffer device (e.g., one including a microcontroller) queues desired discrete increments delivered at the second update rate and manages the corresponding updates of the value in storage at a rate no faster than the first update rate.

In general, in another aspect, the invention features a computer system having a speaker, a unit having a central processor, a monitor separate from the unit, a video cable connecting the unit to the monitor, and a volume control for the speaker, the volume control being mounted in the monitor. Circuitry in the unit responds to the volume control by adjusting the volume output of the speaker.

In general, in another aspect, the invention features a computer system having a speaker, a unit having a central processor, and a video controller. The computer system has a monitor separate from the unit and a volume control for the speaker, the volume control being mounted in the monitor. The video cable has lines used by the video controller to communicate with the monitor and two lines for controlling volume of the speaker. The computer system has circuitry in the unit connected to the two lines for responding to the volume control by adjusting the volume output of the speaker.

In general, in another aspect, the invention features an apparatus for controlling a level of a perceptible characteristic of a feature of a multimedia presentation that is presented by a feature generating device associated with a computer. The apparatus has a control configured to permit a user to indicate a desired level of the perceptible characteristic and a multiple line video cable having lines connecting a video controller of the computer with a video display device. The apparatus has feature circuitry having a feature output connected to deliver feature signals to drive the feature generating device, the feature circuitry being connected at one end of at least one line of the video cable and the user control being connected at another end of the at least one line of the video cable to enable the control to communicate with the feature circuitry.

In general, in another aspect, the invention features an apparatus for controlling a level of a perceptible characteristic of a feature of a multimedia presentation that is presented by a feature generating device associated with a computer. The apparatus has an electromechanical control configured to permit a user to indicate desired discrete increments in the level of the perceptible characteristic, the control including a motion encoder which outputs a signal corresponding to the desired discrete increments. The apparatus has feature circuitry having a feature output connected to deliver feature signals to drive the feature generating device. The feature circuitry includes storage for a value indicative of a level of the perceptible characteristic of the feature signals that the feature circuitry is set to deliver, the stored value being accessible to other devices of the computer and the feature circuitry being responsive to the output signal of the encoder to change the stored value indicative of the desired level of the perceptible characteristic.

In general, in another aspect, the invention features an apparatus for controlling a level of a perceptible characteristic of a feature of a multimedia presentation that is presented by a feature delivered by a feature generating device associated with a computer. The apparatus has feature circuitry having a feature output connected to deliver feature signals to drive the feature generating device. The feature circuitry includes storage for a changeable discrete value indicative of a level of the perceptible characteristic of the feature signals that the feature circuitry is set to deliver, the feature circuitry incapable of updating the storage at a rate faster than a first update rate. The apparatus has a control configured to permit a user to indicate desired discrete increments in the level of the perceptible characteristic, the increments being indicated at a second update rate faster than the first update rate. The apparatus also has a buffer device to queue desired discrete increments delivered at the second update rate and manage the corresponding updates of the value in storage at a rate no faster than the first update rate.

In general, in another aspect, the invention features a method for use in a computer system. The method includes using a microphone and a speaker to enable a speakerphone, the speakerphone having a definable level of volume. The method includes receiving a desired adjustment to the definable level and adjusting the definable level based on the desired adjustment.

In general, in another aspect, the invention features a computer system having a video display device, a video controller, and a feature generating device. The computer system has an apparatus for controlling a level of a perceptible characteristic of a feature of a multimedia presentation that is presented by the feature generating device. The apparatus includes a control configured to permit a user to indicate a desired level of the perceptible characteristic and a multiple line video cable having lines connecting the video controller with the video display device. The feature circuitry has a feature output connected to deliver feature signals to drive the feature generating device. The feature circuitry is connected at one end of at least one line of the video cable and the user control is connected at another end of the at least one line of the video cable to enable the control to communicate with the feature circuitry.

In general, in another aspect, the invention features a computer system having a feature generating device for generating a multimedia presentation having a perceptible characteristic and an electromechanical control. The control is configured to permit a user to indicate desired discrete increments in a level of the perceptible characteristic, and the control includes a motion encoder which outputs a signal corresponding to the desired discrete increments. The computer system has feature circuitry having a feature output connected to deliver feature signals to drive the feature generating device. The feature circuitry includes storage for a value indicative of a level of the perceptible characteristic of the feature signals that the feature circuitry is set to deliver. The stored value is accessible to other devices of the computer, and the feature circuitry is responsive to the output signal of the encoder to change the stored value indicative of the desired level of the perceptible characteristic.

In general, in another aspect, the invention features a computer system having a feature generating device for generating a multimedia presentation having a perceptible characteristic. The computer system has feature circuitry having a feature output connected to deliver feature signals to drive the feature generating device. The feature circuitry includes storage for a changeable discrete value indicative of a level of the perceptible characteristic of the feature signals that the feature circuitry is set to deliver. The feature circuitry is incapable of updating the storage at a rate faster than a first update rate. The computer system has a control configured to permit a user to indicate desired discrete increments in the level of the perceptible characteristic. The increments are indicated at a second update rate faster than the first update rate. The computer system also has a buffer device to queue desired discrete increments delivered at the second update rate and manage the corresponding updates of the value in storage at a rate no faster than the first update rate.

In general, in another aspect, the invention features a computer system having a video cable and a first circuit connected to one end of the cable and configured to receive a signal from the cable. The computer system has a video display device connected to receive video data from another end of the cable. The computer system has a second circuit connected to furnish the signal to the another end of the cable and a video controller connected to furnish the video data to the one end of the cable.

In general, in another aspect, the invention features a method for use in a computer system having a video monitor connected to receive video data from one end of a cable and a circuit connected to receive a signal from another end of the cable. The method includes furnishing the video data to the another end of the cable and furnishing the signal to the one end of the cable.

Among the advantages of the invention are one or more of the following. Commonly available VGA connectors and cables may be used. Software of the computer system may track the volume or other characteristics of sound produced by the speakers, as updated by a control knob. The volume level of a speakerphone of the computer system may be adjusted via the control knob. The actual volume or other characteristics of sound from the speakers may be displayed on the screen of a monitor. Volume control and muting information are encoded together, thereby minimizing dedicated control lines of the VGA cable. Rapid changes in the position of the control knob are queued, thereby preventing "slippage." Changes in volume are independent of the absolute position of the volume control knob.

Other advantages and features will become apparent from the following description and from the claims.

DESCRIPTION

FIG. 3 is a schematic block diagram of the volume control circuit.

FIG. 4 is a front view of a video graphics adaptor (VGA) connector.

Figure 1:
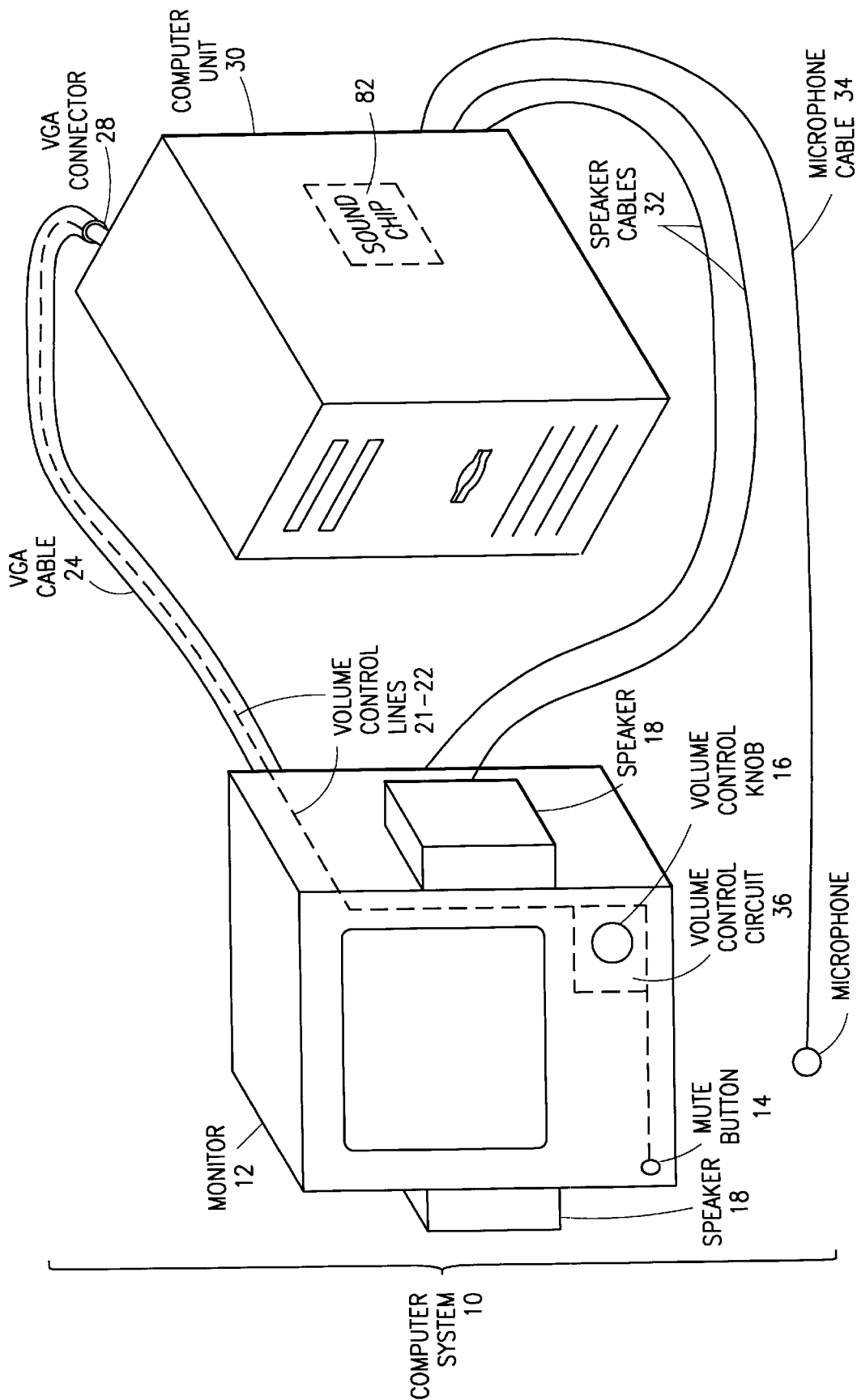
FIG. 1 is a perspective view of a computer system.

As shown in FIG. 1, in a computer system 10, a volume control circuit 36 (mounted a monitor 12) interacts with a sound chip 82 (of a computer unit 30) to control the volume of sound emanating from two speakers 18. For purposes of indicating a desired change in volume, a user may turn a volume control knob 16 of the monitor 12 to indicate whether the volume should be increased (clockwise rotation) or decreased (counterclockwise rotation). The user may also selectively mute sound via a mute button 14 of the monitor 12. The volume control circuit 36 monitors the mute button 14 (for depression) and the knob 16 (for rotation) and communicates this information to the sound chip 82 via two otherwise unused lines (volume control lines 21–22) of a conventional video graphics adaptor (VGA) cable 24. The lines 21–22 correspond to pins four and eleven of the VGA connector 28 (FIG. 4).

The volume of sound emanating from the speakers 18 is adjusted at the source (the sound chip 82) instead of, for example, by an amplifier near the speakers 18. By adjusting the volume at the source instead of near the speakers 18, unwanted noise (e.g., noise from the monitor) emanating from the speakers 18 is reduced, and software of the computer system 10 can read from the sound chip 82 the data level indicating the actual volume of sound emanating from the speakers 18. Emulation of a speakerphone may be achieved via the modem 68, the sound chip 82, the microphone 20, and the speakers 18. The modem 68 interacts with the sound chip 82 to properly adjust the input volume level of the microphone 20 to prevent acoustical feedback. Therefore, high performance for a duplex speakerphone may be achieved as the actual volume level of the sound chip 82 is always known.

Figure 18:
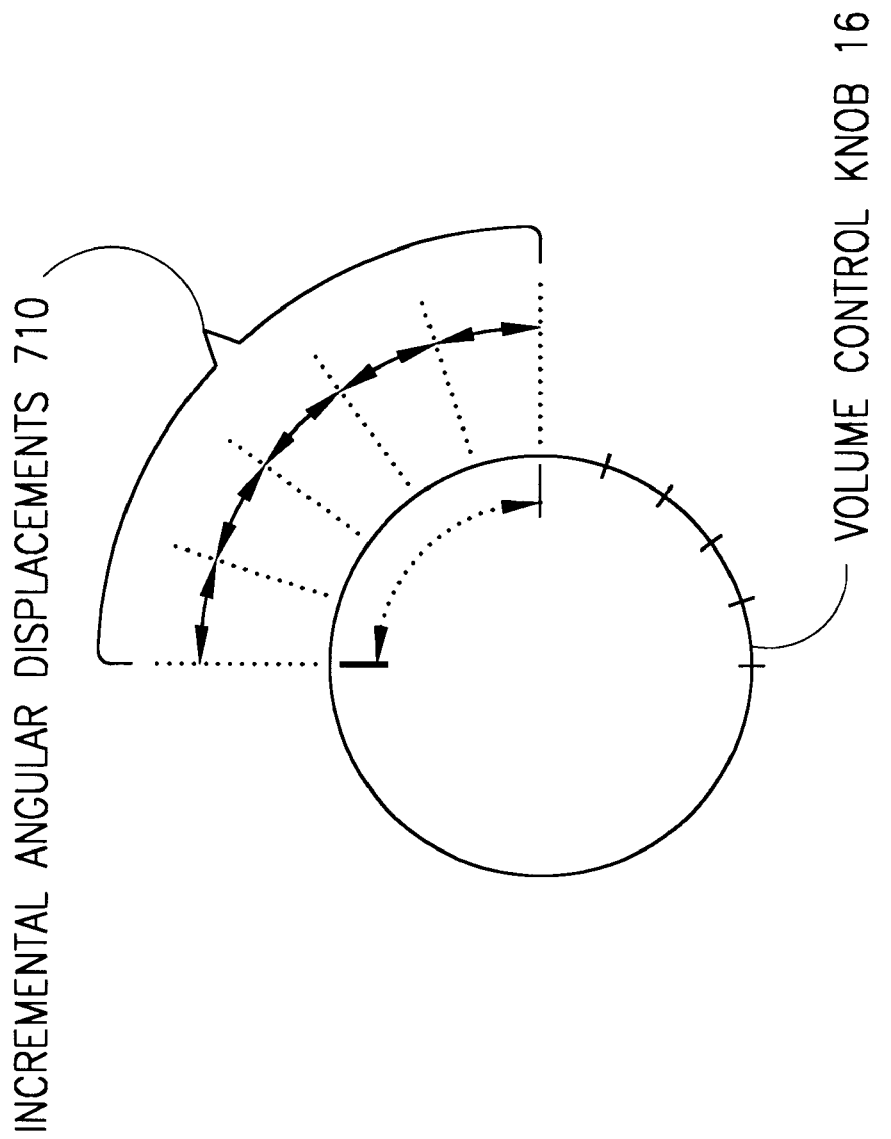
FIG. 18 is a front view of the volume control knob.

For purposes of indicating the magnitude of the desired change in volume, the volume control circuit 36 tracks discrete incremental angular displacements 710 (FIG. 18) of the knob 16. Because the incremental angular displacements 710 (and not the absolute angular position) of the knob 16 indicates desired adjustments in the volume, the knob 16 may be freely rotated in either direction without stops limiting rotation. The 360 degree angular rotation of the knob 16 is uniformly divided into a predetermined number (e.g., twenty) of incremental angular displacements 710. Each incremental angular displacement 710 is indicated to the user via a "click," and each click represents a desired increment of change (up or down) in the volume. Because the knob 16 may be turned at a rate faster than the sound chip 82 can adjust the volume (referred to as "slippage"), the volume control circuit 36 queues all detected incremental angular displacements 710. The volume control circuit 36 replays the incremental angular displacements 710 that are queued back to the sound chip 82 at a rate the sound chip 82 can accommodate.

Figure 2:
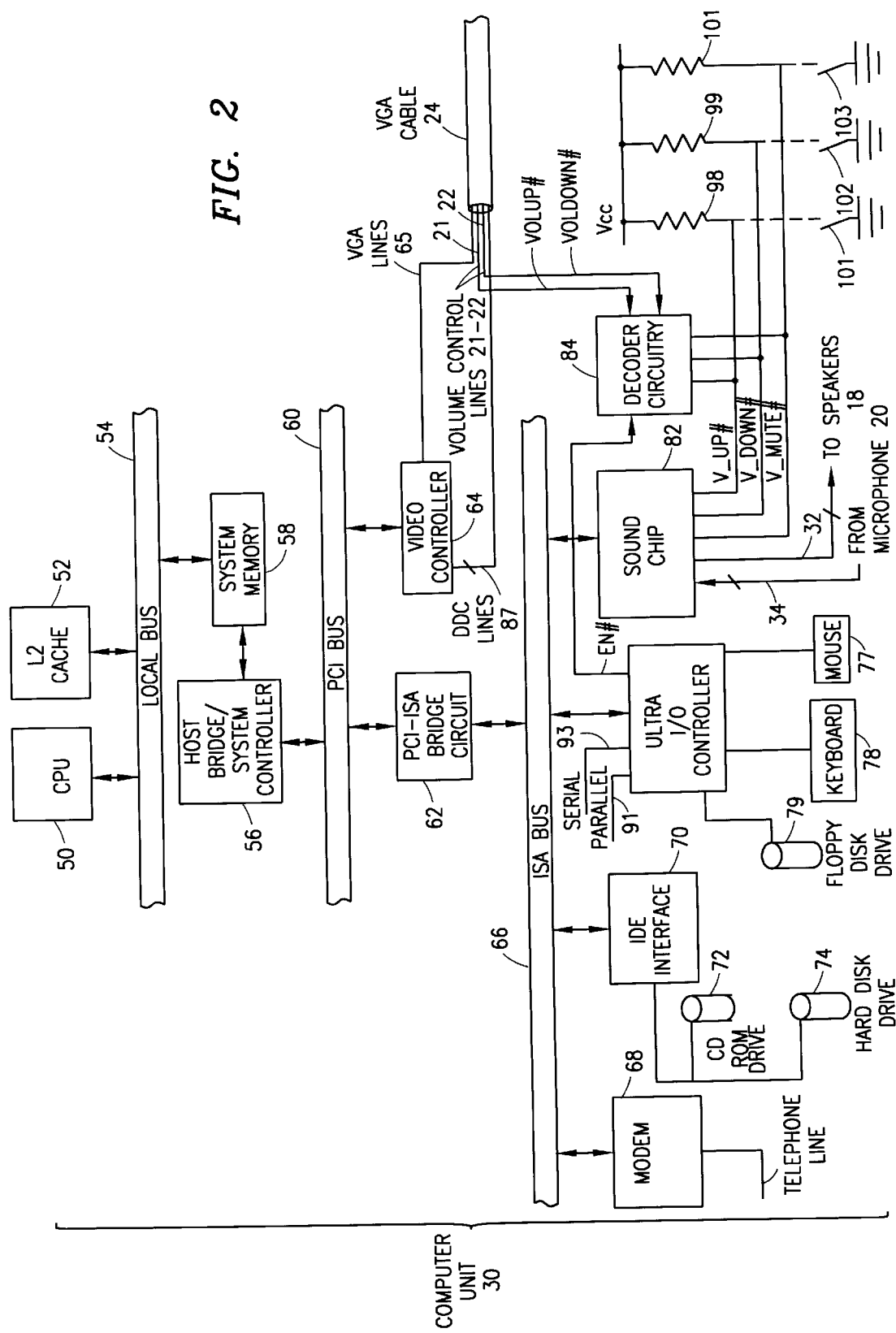
FIG. 2 is a schematic block diagram of the computer system.

As shown in FIG. 2, the computer unit 30 includes a central processing unit (CPU) 50, a level two (L2) cache 52, and a system memory 58, all of which are coupled to a local bus 54. A host bridge/system controller 56 interfaces the local bus 54 to a Peripheral Component Interconnect (PCI) bus 60 and controls access to the system memory 58. Coupled to the PCI bus 60 is a PCI-Industry Standard Architecture (ISA) bridge circuit 62 and a video controller 64. The video controller 64 sends video data to the monitor 12 via VGA lines 65 of the VGA cable 24, and the bridge circuit 62 interfaces the PCI bus 60 to an ISA bus 66. Coupled to the ISA bus 66 is a modem 68 (used in conjunction with the sound chip 82 to emulate the speakerphone), an Intelligent Drive Electronics (IDE) interface 70, an Ultra I/O controller 76 (e.g., Part No. 34C931+ made by SMC), and the sound chip 82. The IDE interface 70 controls a CD-ROM drive 72 and a hard disk drive 74. The I/O controller 76 controls operation of a floppy disk drive 79 and provides an interface to a keyboard 78, a mouse 77, a serial port 93 and a parallel port 91.

For purposes of identifying features (e.g., manufacturer and model) of the monitor 12, the CPU 50 interacts with the video controller 64 to instruct the video controller 64 to read the features of the monitor 12 via Digital Data Channel (DDC) lines 87 that extend from the video controller 64, through the cable 24, and to the monitor 12. The sound chip 82 (e.g., Part Nos. 1888, 1788, or 1688 made by ESS Technology) has its microphone input coupled to the microphone 20 via a microphone cable 34, and the speaker output of the sound chip 82 is coupled to the speakers 18 via speaker cables 32.

For purposes of minimizing the number of lines of the VGA cable 24 used for volume control, the volume control circuit 36 (FIG. 1) furnishes a volume control signal VOLUP# to the volume control line 21 and a volume control signal VOLDOWN# to the volume control line 22, wherein the suffix "#" denotes negative logic. The signals VOLUP# and VOLDOWN# are used to indicate whether the user wants to increase or decrease the volume, respectively. The muting information is encoded into the signals VOLUP# and VOLDOWN#, as described below. Decoder circuitry 84 of the computer unit 30 receives the volume control signals VOLUP# and VOLDOWN# from the lines 21–22, decodes the muting information from these signals, and furnishes three volume control signals (V_UP#, V_DOWN# and V_MUTE#) to the sound chip 82. The signals V_UP#, V_DOWN# and V_MUTE# are used to increase the volume, decrease the volume, and mute the volume, respectively. The volume control signals V_UP#, V_DOWN# and V_MUTE# are at a logical one voltage level when deasserted, as established by pull-up resistors 98–100.

The CPU 50 interacts with the video controller 64 to determine (via the DDC lines 87) if the monitor connected to the computer unit 30 supports use of the volume control lines 21–22, and based on this determination, the CPU 50 interacts with the video controller 64 to selectively enable (monitor supports use of the volume control lines 21–22) or disable (monitor does not support use of the volume control lines 21–22) the decoder circuitry 84. If the decoder circuitry 84 is disabled, push button switches 101–103 (located at the computer unit 30) coupled between the signals V_UP#, V_DOWN#, and V_MUTE# and ground may be used to generate these signals. The CPU 50 interacts with the I/O controller 76 to enable the decoder circuitry 84 by asserting, or driving low, an enable signal EN# (furnished by the I/O controller 76 and received by the decoder circuitry 84), and the CPU 50 interacts with the I/O controller 76 to disable the decoder circuitry 84 by deasserting, or driving high, the enable signal EN#.

As shown in FIG. 3, the volume control circuit 36 has a shaft encoder 152 which monitors rotation of the volume control knob 16. For purposes of electrically indicating the direction of rotation of the knob 16, the shaft encoder 152 furnishes two pulse train signals A and B. Both signals have a frequency indicative of the rate at which the user rotates the knob 16. The signals A and B are identical except for the relative phase between the signals A and B which indicates whether the control knob 16 is rotating in a counterclockwise rotation or in a clockwise rotation. When the knob 16 is stationary, the signals A and B are negated (logic zero), and when the knob 16 rotates, each discrete incremental angular displacement 710, or "click," of the knob 16 produces one cycle of the signals A and B. A signal MUTE and the signals A and B are received by a volume encoder circuit 150 which furnishes the signals VOLUP# and VOLDOWN#. When the mute button 14 is depressed, the signal MUTE is asserted, or driven high. The signal MUTE is otherwise deasserted. The signal MUTE is furnished by one end of a resistor 154 which is coupled to one terminal of a series switched path 155 activated by the mute button 14. The other end of the resistor 154 is coupled to ground. The other terminal of the series switched path 155 is serially coupled to a DC supply voltage level via a pull-up resistor 156.

Figure 5:
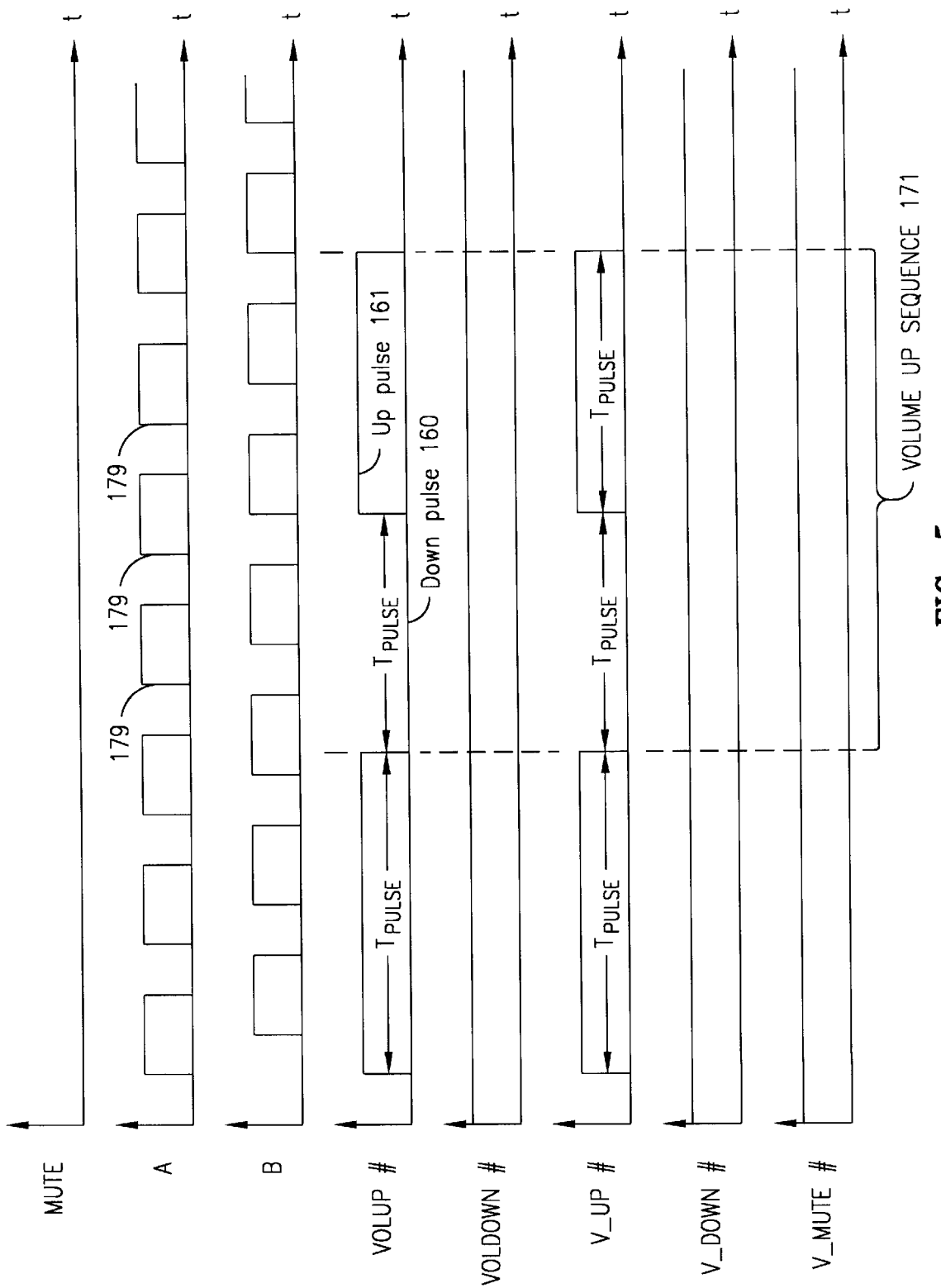
FIGS. 5–7 are timing diagrams showing waveforms of the volume control circuit.
Figure 17:
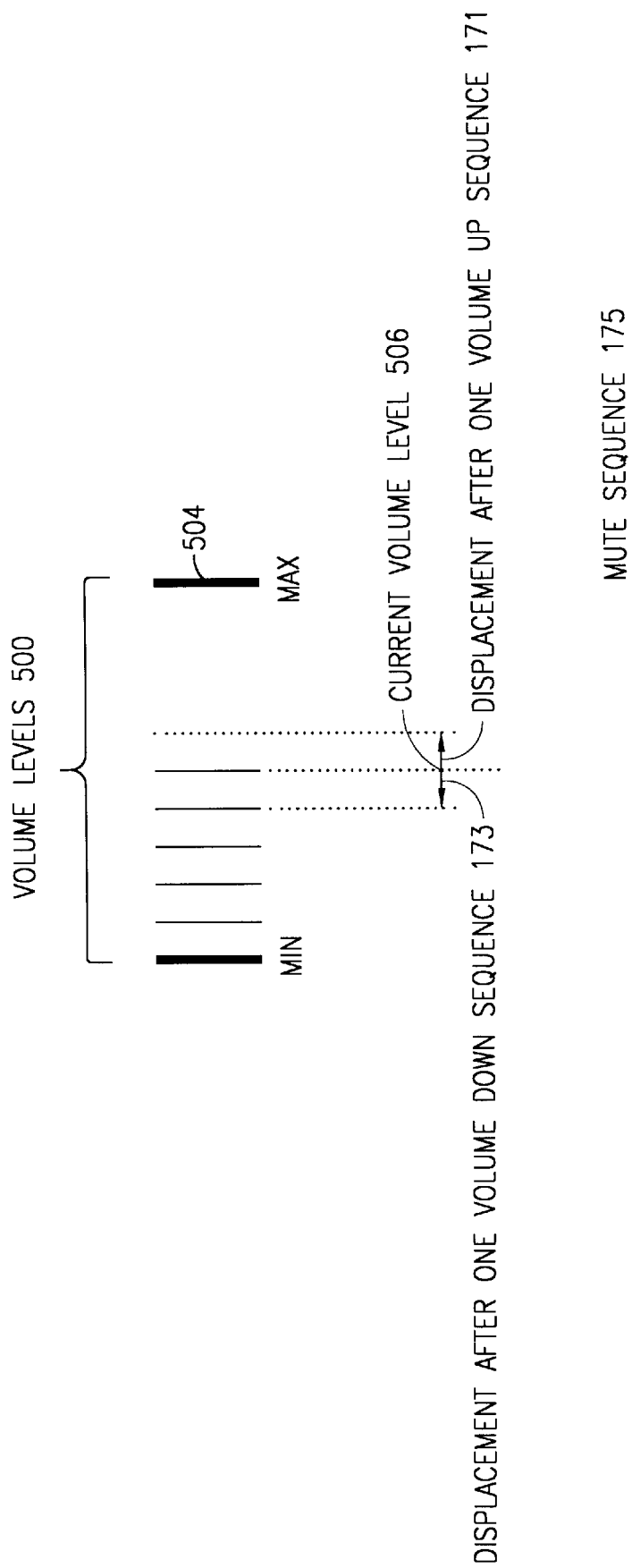
FIG. 17 is an illustration of the volume levels of the sound chip.

As shown in FIG. 5, when the knob 16 rotates in a clockwise rotation (indicating a desired increase in volume), the signal B leads the signal A. When the volume encoder circuit 150 detects this occurrence (and the signal MUTE is not asserted, or high), the volume encoder circuit 150 generates a volume up sequence 171. During the volume up sequence 171, the signals V_UP# and V_DOWN# are equivalent to the signals VOLUP# and VOLDOWN#, respectively. The volume encoder circuit 150 begins the volume up sequence 171 by the assertion, or driving low, of the signal VOLUP# for a down pulse 160 of duration $T_{PULSE}$. The down pulse 160 indicates to the sound chip 82 to increase the volume by one discrete volume level 500 (FIG. 17). The duration $T_{PULSE}$ satisfies the timing requirements (e.g., a minimum duration of 40 ms.) of the sound chip 82. After the down pulse 160, the volume encoder circuit 150 deasserts, or drives high, the signal VOLUP# for an up pulse 161 of duration $T_{PULSE}$. The duration $T_{PULSE}$ of the up pulse 161 satisfies the requirements of the sound chip 82 that a predetermined minimum duration must exist between successive down pulses before the sound chip 82 will recognize all down pulses. During the volume up sequence 171, the signal VOLDOWN# remains deasserted, or low.

Figure 6:
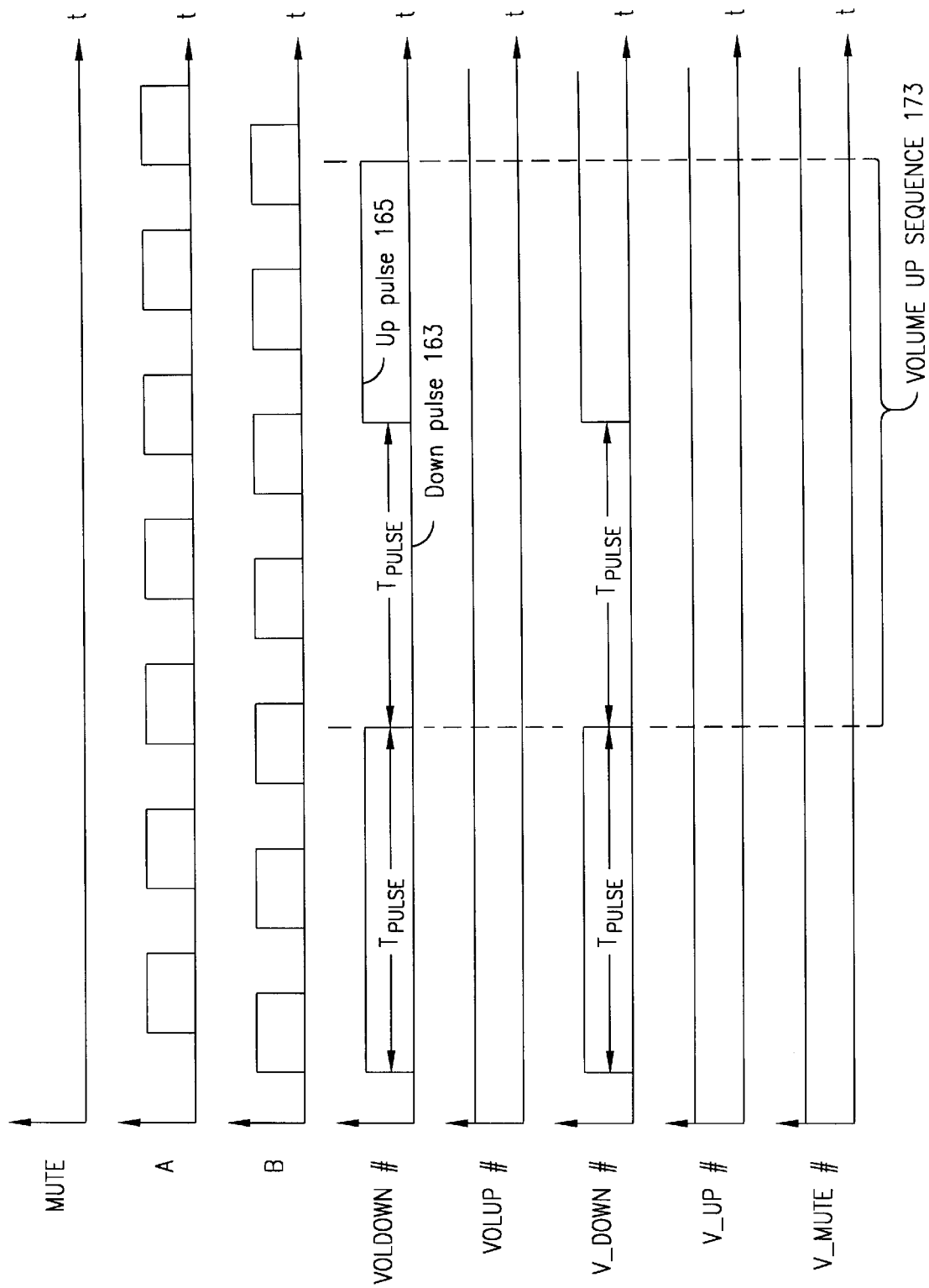

As shown in FIG. 6, when the knob 16 rotates in a counterclockwise rotation (indicating a desired decrease in volume), the signal B lags the signal A. When the volume encoder circuit 150 detects this occurrence (and the signal MUTE is not asserted, or high), the volume encoder circuit 150 generates a volume down sequence 173. During the volume down sequence 173, the signals V_UP# and V_DOWN# are equivalent to the signals VOLUP# and VOLDOWN#, respectively. The volume encoder circuit 150 begins the volume down sequence 173 by the assertion, or driving low, of the signal VOLDOWN# for a down pulse 163 of duration $T_{PULSE}$. The down pulse 163 indicates to the sound chip 82 to decrease the volume by one discrete volume level 500. After the down pulse 163, the volume encoder circuit 150 deasserts, or drives high, the signal VOLDOWN# for an up pulse 163 of duration $T_{PULSE}$. The duration $T_{PULSE}$ of the up pulse 163 satisfies timing requirements of the sound chip 82 for successive down pulses. The signal VOLUP# remains deasserted, or low, during the volume down sequence 173.

Figure 7:
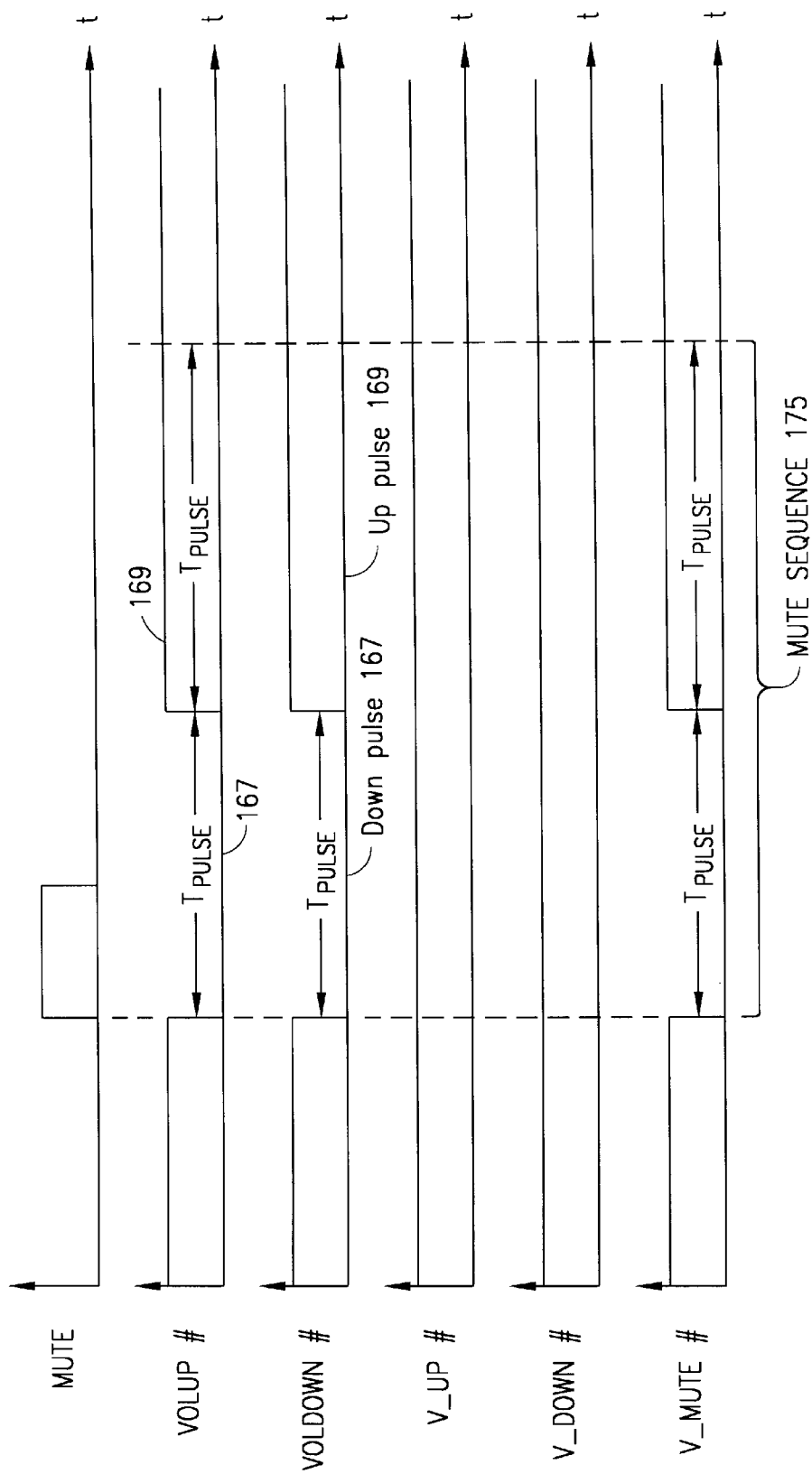

As shown in FIG. 7, for purposes of encoding the mute information in the two signals VOLDOWN# and VOLUP#, the volume encoder circuit 150 takes advantage of the fact that the signals VOLUP# and VOLDOWN# are not otherwise concurrently asserted, or driven low. Therefore, for purposes of furnishing an indication to the sound chip 82 to toggle the muting of volume, the volume encoder circuit 150 generates a mute sequence 175 when the volume encoder circuit 150 detects assertion of the signal MUTE. During the mute sequence 175, the signals VOLUP#, VOLDOWN#, and V_MUTE# are all equivalent. To begin the mute sequence 175, the volume encoder circuit 150 concurrently asserts, or drives low, both the signals VOLUP# and VOLDOWN# for a down pulse 167 of duration $T_{PULSE}$. The duration $T_{PULSE}$ satisfies timing requirements of the sound chip 82. The volume encoder circuit 150 completes the mute sequence 175 by concurrently deasserting, or driving high, both the signals VOLUP# and VOLDOWN# for an up pulse 169 of duration $T_{PULSE}$. The duration $T_{PULSE}$ of the up pulse 169 satisfies timing requirements of the sound chip 82. The signals VOLUP# and VOLDOWN# remain deasserted until the mute button 14 is depressed again. The mute sequence 175 takes precedence over the volume up 171 and volume down 173 sequences.

As shown in FIG. 17, the sound chip 82 has discrete, multiple volume levels 500. Each volume up 171 and volume down 173 sequence changes the current volume level 506 by one discrete volume level 500. Because the knob 16 may be turned very rapidly, the period of the signals A and B may be of shorter duration than the volume up 171 and volume down 173 sequences. Therefore, several "clicks" of the knob 16 may occur while the sound chip 82 is currently incrementing or decrementing one volume level 500. For purposes of accounting for all incremental angular displacements 710 of the knob 16, the volume encoder circuit 150 queues the incremental angular displacements 710 that occur during the volume up 171 and volume down 173 sequences. For example, as shown in FIG. 5, during the volume up sequence 171, the knob 16 may undergo three incremental angular displacements 710, as indicated by the three positive edges 179 of the signal A. For this example, the volume encoder circuit 150 generates three volume up sequences 171 to carry out the incremental angular displacements 710 that are queued.

Figure 10:
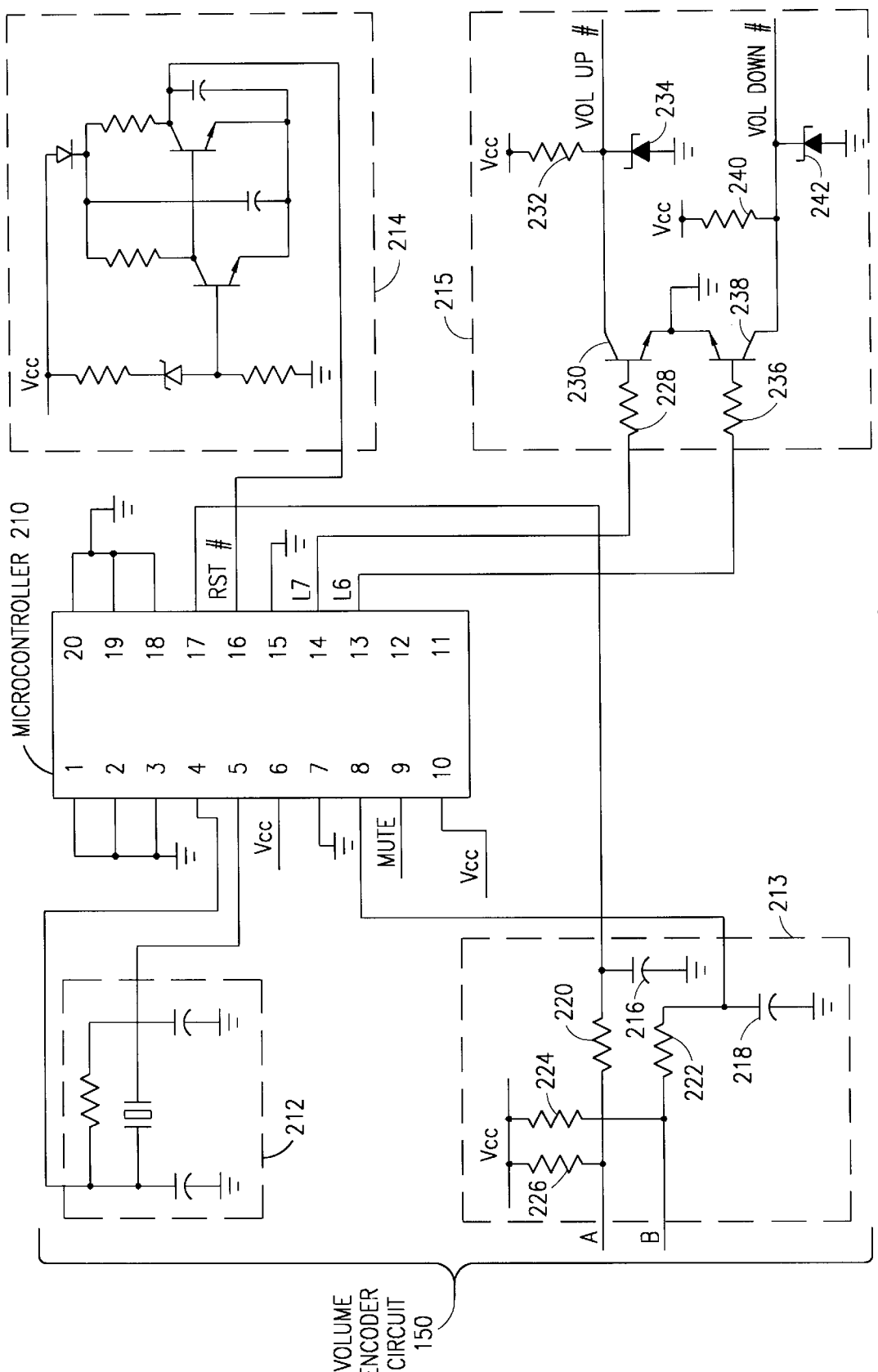
FIG. 10 is a schematic diagram of the volume decoder circuit of FIG. 3.
Figure 11:
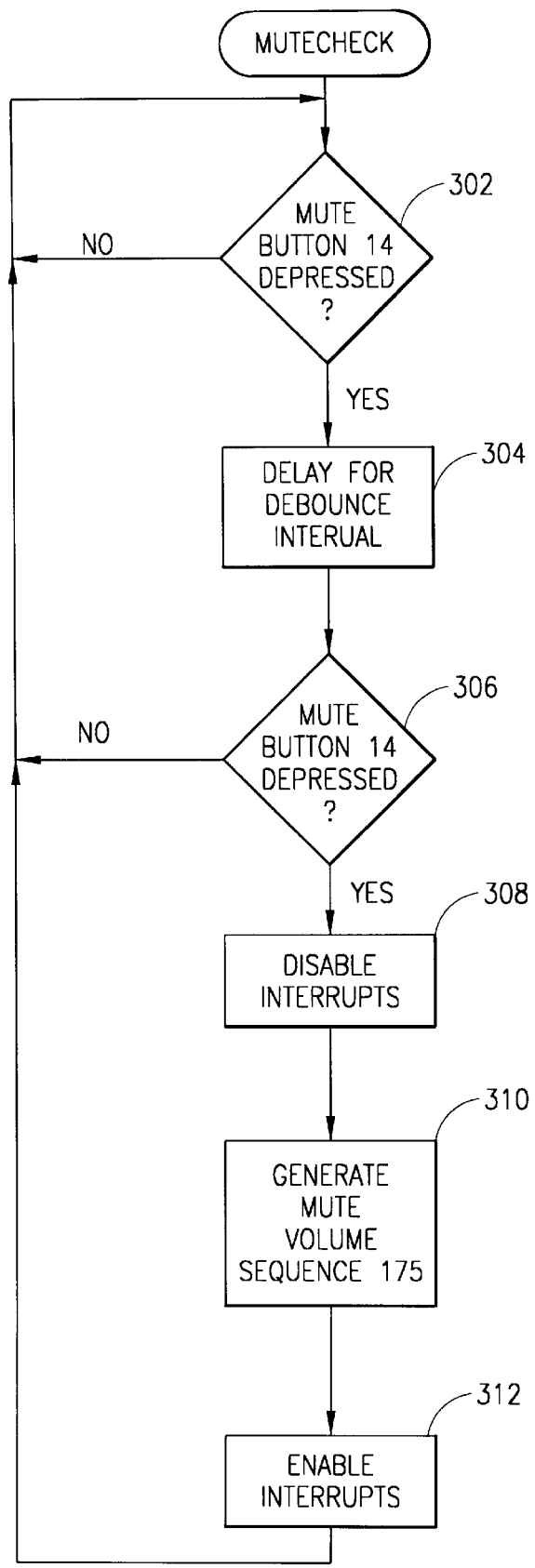
FIGS. 11–13 are flow diagrams illustrating routines executed by the microcontroller of the volume decoder circuit.

As shown in FIGS. 3 and 10, the volume encoder circuit 150 includes an eight bit microcontroller 210 (e.g., Part No. COP912CH, made by National Semiconductor) and other circuits 212–215 (described below) which permit the microcontroller 210 to receive the signals A, B, and MUTE and generate the signals VOLUP# and VOLDOWN#. Examples of algorithms (written in assembly code) executed by the microcontroller 210 are included in Appendix A, which is hereby incorporated by reference. As shown in FIG. 11, in a routine called MUTECHECK used to monitor the mute button 14, the microcontroller 210 determines 302 if the mute button 14 has been depressed (i.e., the signal MUTE is asserted, or high). If so, the microcontroller 210 debounces the mute button 14 by delaying 304 for the duration of a debounce interval and subsequently determining 306 if the mute button 14 is still depressed. If the mute button 34 has been depressed for the duration of the debounce interval (i.e., not a glitch) the microcontroller 210 disables 308 the occurrence of interrupts, subsequently generates 310 the mute sequence 175, and then enables 312 the occurrence of interrupts. The microcontroller 210 then resumes debouncing 302–306 the mute button 14.

For purposes of detecting the incremental angular displacement 710 of the knob 16, the microcontroller 210 is configured such that the positive edge of the signal A (present only when the knob 16 is rotated) generates an interrupt request to the microcontroller 210. The microcontroller 210 executes a routine called EXTINT to service this interrupt request.

Figure 12:
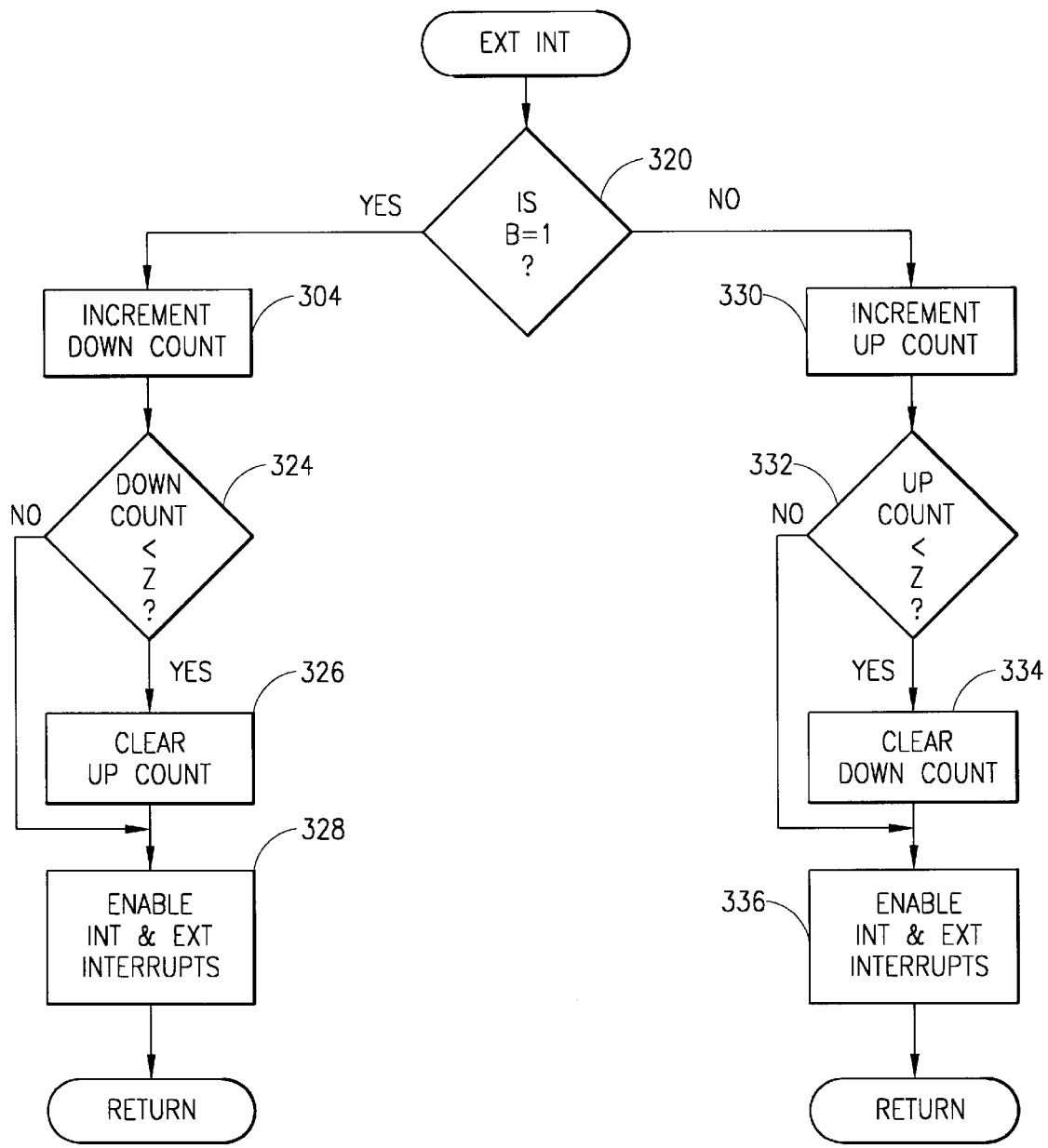

As shown in FIG. 12, in the EXTINT routine, for purposes of determining the direction of rotation of the knob 16 (i.e., the phase relationship of the signals A and B), the microcontroller 210 determines 320 if the signal B is high (counterclockwise rotation of the knob 16) or low (clockwise rotation of the knob 16). For purposes of queuing the angular displacements 710 of the knob 16, if the signal B is high, the microcontroller 210 increments 322 a parameter called DOWNCOUNT which indicates the number of queued counterclockwise incremental angular displacements 710. The microcontroller 210 clears 326 a parameter called UPCOUNT (indicates the number of queued clockwise incremental angular displacements 710) if the microcontroller 210 determines 324 the DOWNCOUNT parameter is greater than a predetermined maximum number (e.g., two). The microcontroller 210 then enables 328 the occurrence of interrupt requests and returns form the EXTINT routine.

If the microcontroller 210 determines 320 that the signal B is low (clockwise rotation of the knob 16), then the microcontroller 210 increments 330 the UPCOUNT parameter. The microcontroller 210 clears 334 the DOWNCOUNT parameter if the microcontroller 210 determines 332 the UPCOUNT parameter is greater than a predetermined maximum number (e.g., two). The microcontroller 210 then enables 336 the occurrence of interrupt requests and returns from the EXTINT routine.

Figure 13:
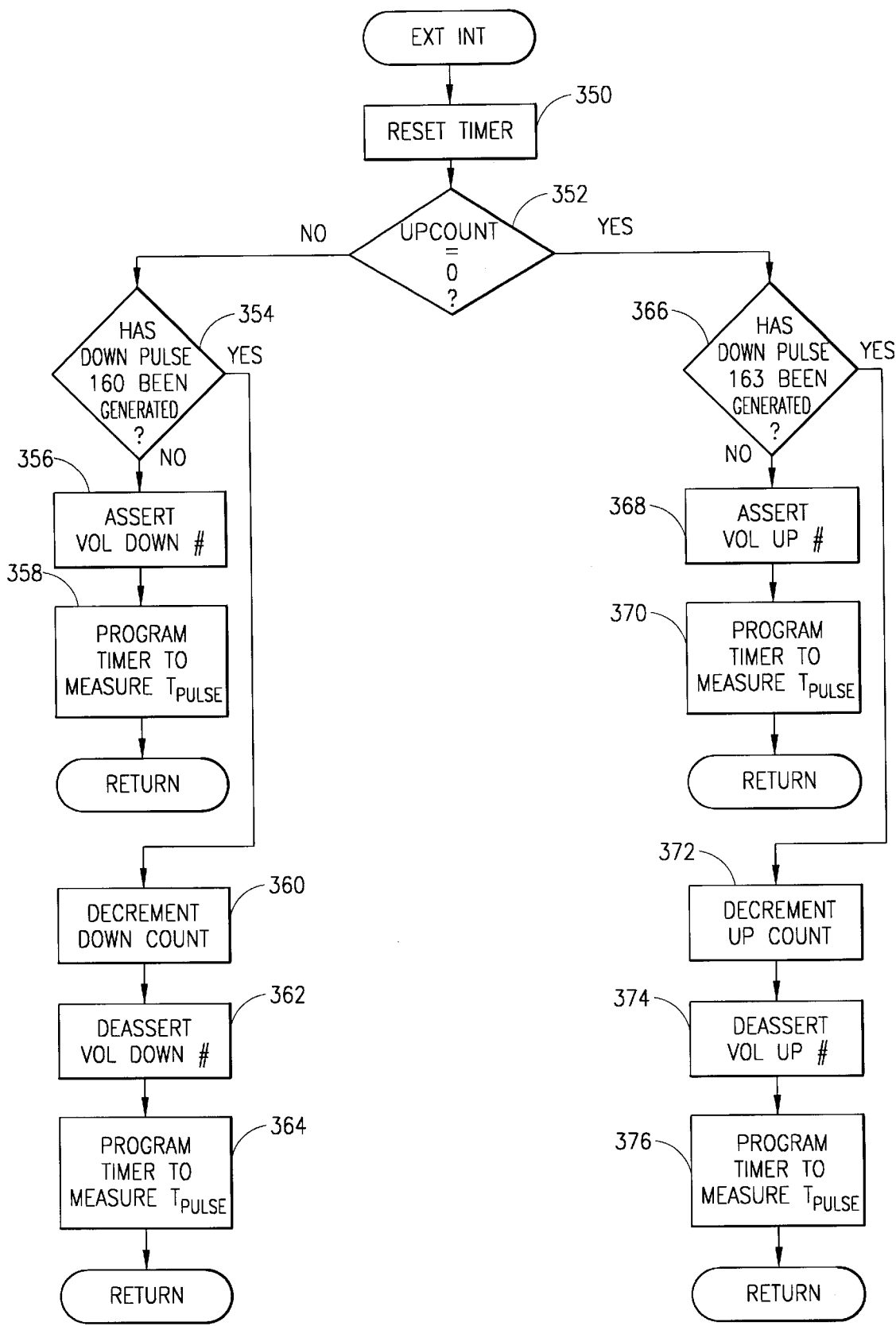

For purposes of generating the pulses 160, 161, 163 and 165 of the sequences 171 and 173, the microcontroller 210 uses an internal programmable timer (not shown) to measure the interval $T_{PULSE}$. The timer indicates expiration of the time interval $T_{PULSE}$ by generating an interrupt request. As shown in FIG. 13, the microcontroller 210 executes a routine called TMRINT to service the interrupt request generated by the timer. The microcontroller 210 first resets 350 the timer. The microcontroller 210 then determines 352 whether the UPCOUNT parameter is equal to zero. If the UPCOUNT parameter is non-zero (a volume up sequence 171 is underway), the microcontroller 210 determines 354 whether the down pulse 160 has been generated. If the down pulse 160 has not been generated, the microcontroller 210 asserts 356 the signal VOLDOWN# (to begin the down pulse 160), programs 358 the timer to measure the interval $T_{PULSE}$, and returns from the TMRINT routine. If the down pulse 160 has been generated, the microcontroller 210 decrements 360 the DOWNCOUNT parameter, deasserts 362 the signal VOLDOWN# (to end the volume up sequence 171), programs 364 the timer to measure the interval $T_{PULSE}$, and returns from the TMRINT routine.

If the microcontroller 210 determines 352 that the UPCOUNT parameter is equal to zero (the volume down sequence 173 is underway), then the microcontroller 210 determines 366 whether the down pulse 163 has been generated. If the down pulse 163 has not been generated, the microcontroller 210 asserts 368 the signal VOLUP# (to begin the down pulse 163), programs 370 the timer to measure the interval $T_{PULSE}$, and returns from the TMRINT routine. If the down pulse 163 has been generated, the microcontroller 210 decrements 372 the UPCOUNT parameter, deasserts 374 the signal VOLUP# (to end the volume down sequence 173), programs 376 the timer to measure the interval $T_{PULSE}$, and returns from the TMRINT routine.

Figures 8, 9:
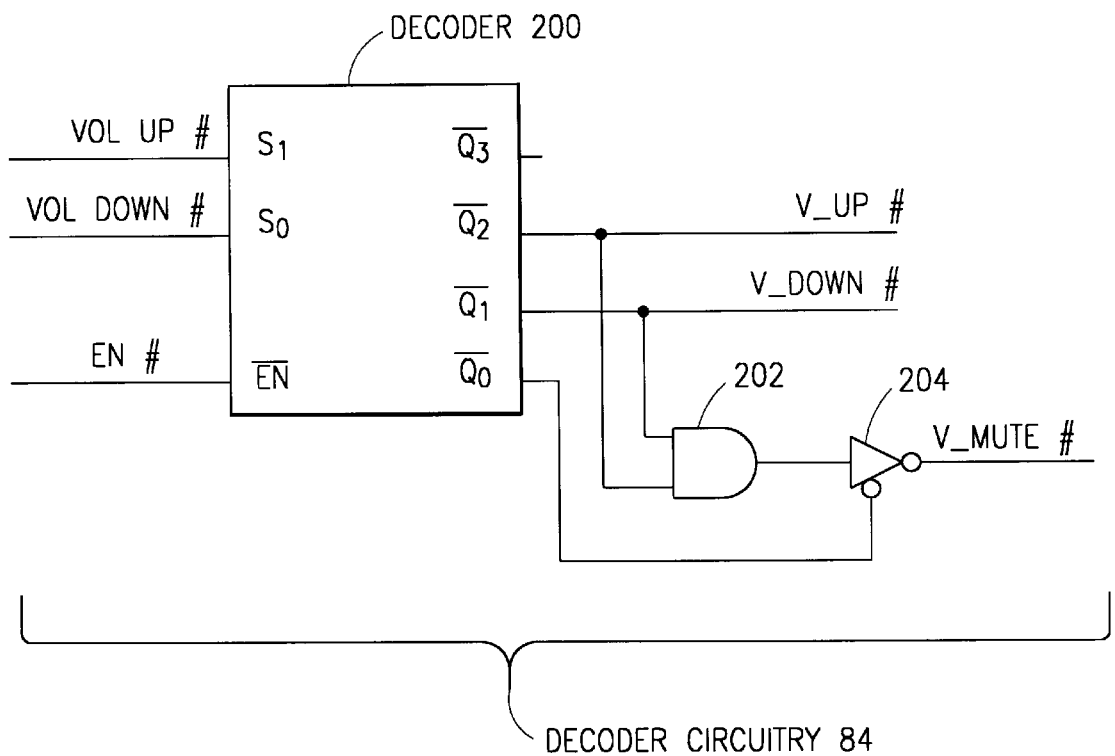
FIG. 8 is a schematic diagram showing the decoder circuitry.
FIG. 9 is a table showing logical states of the decoder circuitry.

As shown in FIGS. 8 and 9, the decoder circuitry 84 includes a 2×4 decoder 200 which receives the signal VOLDOWN# at its zero select input and the signal VOLUP# at its one select input. The enable input of the decoder 200 receives the enable signal EN# from the keyboard controller 76. The zero inverting output of the decoder 200 is connected to the enable input of an inverting tri-state inverter 204 which furnishes the signal V_MUTE#. The input of the inverter 204 is connected to the output of an AND gate 202 which receives the signals V_UP# and V_DOWN#. The signals V_UP# and V_DOWN# are furnished by the second and first inverting outputs, respectively, of the decoder 200.

As shown in FIG. 10, the microcontroller 210 is coupled to circuitry 212 used to establish the frequency of operation of the microcontroller 210 and coupled to voltage protection circuitry 214 used to reset the microcontroller 210 if a DC supply voltage level furnished to the microcontroller 210 drops below a predetermined level. For purposes of furnishing the signal VOLUP#, the microcontroller 210 drives a bipolar NPN transistor 230 which furnishes the signal VOLUP# at its collector. The emitter of the transistor 230 is grounded. A resistor 228 is connected in series between the microcontroller 210 and the base of the transistor 230. Coupled between the signal VOLUP# and ground is a Zener diode 234, and the signal VOLUP is coupled to the DC voltage supply level through a pull-up resistor 232. For purposes of furnishing the signal VOLDOWN#, the microcontroller 210 drives a bipolar NPN transistor 238 which furnishes the signal VOLUP# at its collector. The emitter of the transistor 238 is grounded. A resistor 236 is coupled in series between the microcontroller 210 and the base of the transistor 238. A Zener diode 242 is coupled between the signal VOLDOWN# and ground. A pull-up resistor 240 couples the signal VOLDOWN# to the DC supply voltage level.

The microcontroller 210 receives the signal A through a low pass filter having a series resistor 220 and a capacitor 216 coupled to ground. A pull-up resistor 224 is coupled between the signal A and the DC voltage supply level. The microcontroller 210 is coupled to the signal B through a low pass filter having a series resistor 222 and a capacitor 218 coupled to ground. A pull-up resistor 224 is coupled between the signal B and the DC voltage supply level. The microcontroller 210 receives the signal MUTE.

Figure 14:
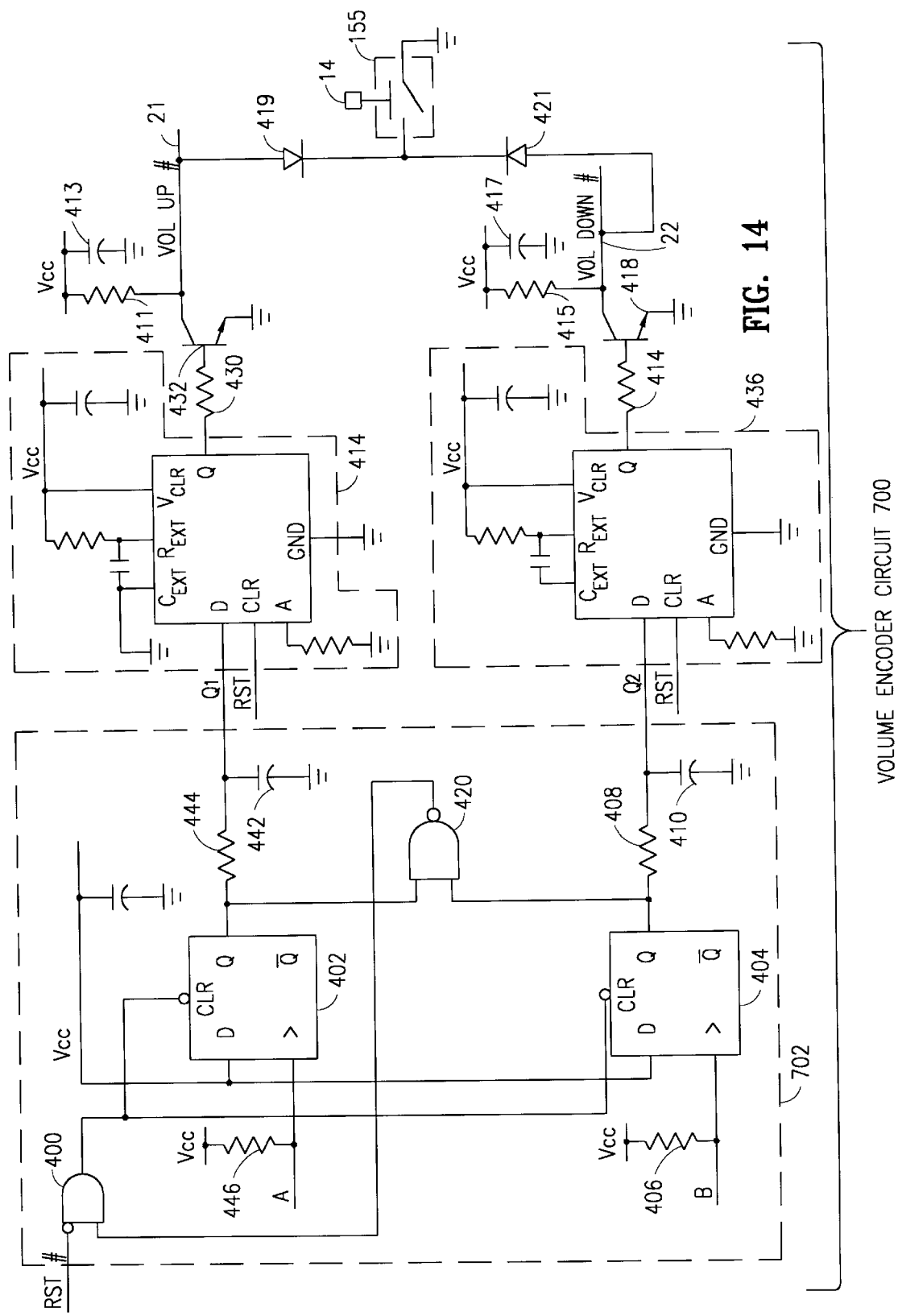
FIG. 14 is a schematic diagram of a volume decoder circuit.
Figure 15:
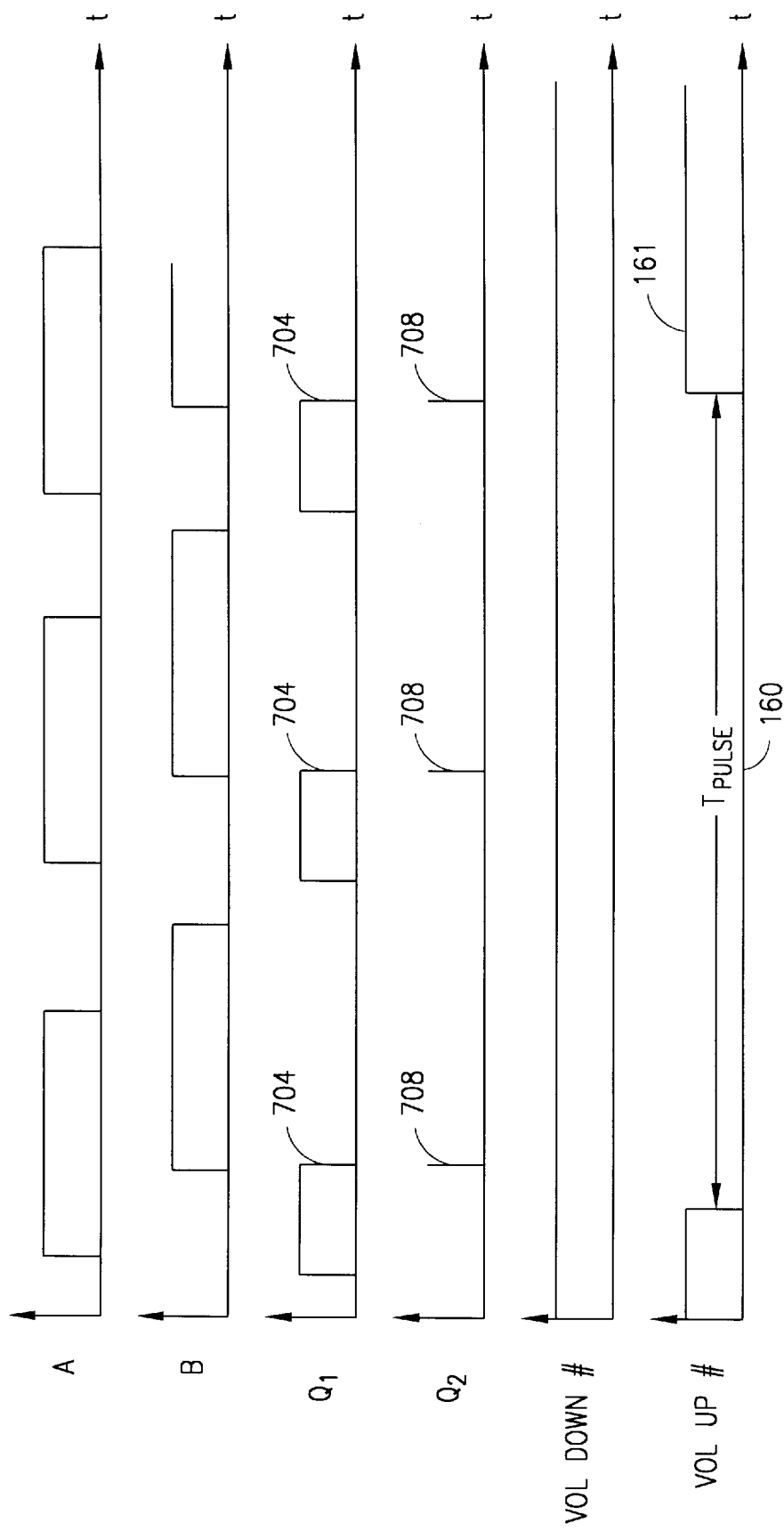
FIGS. 15–16 are waveforms from the volume decoder circuit of FIG. 14.
Figure 16:
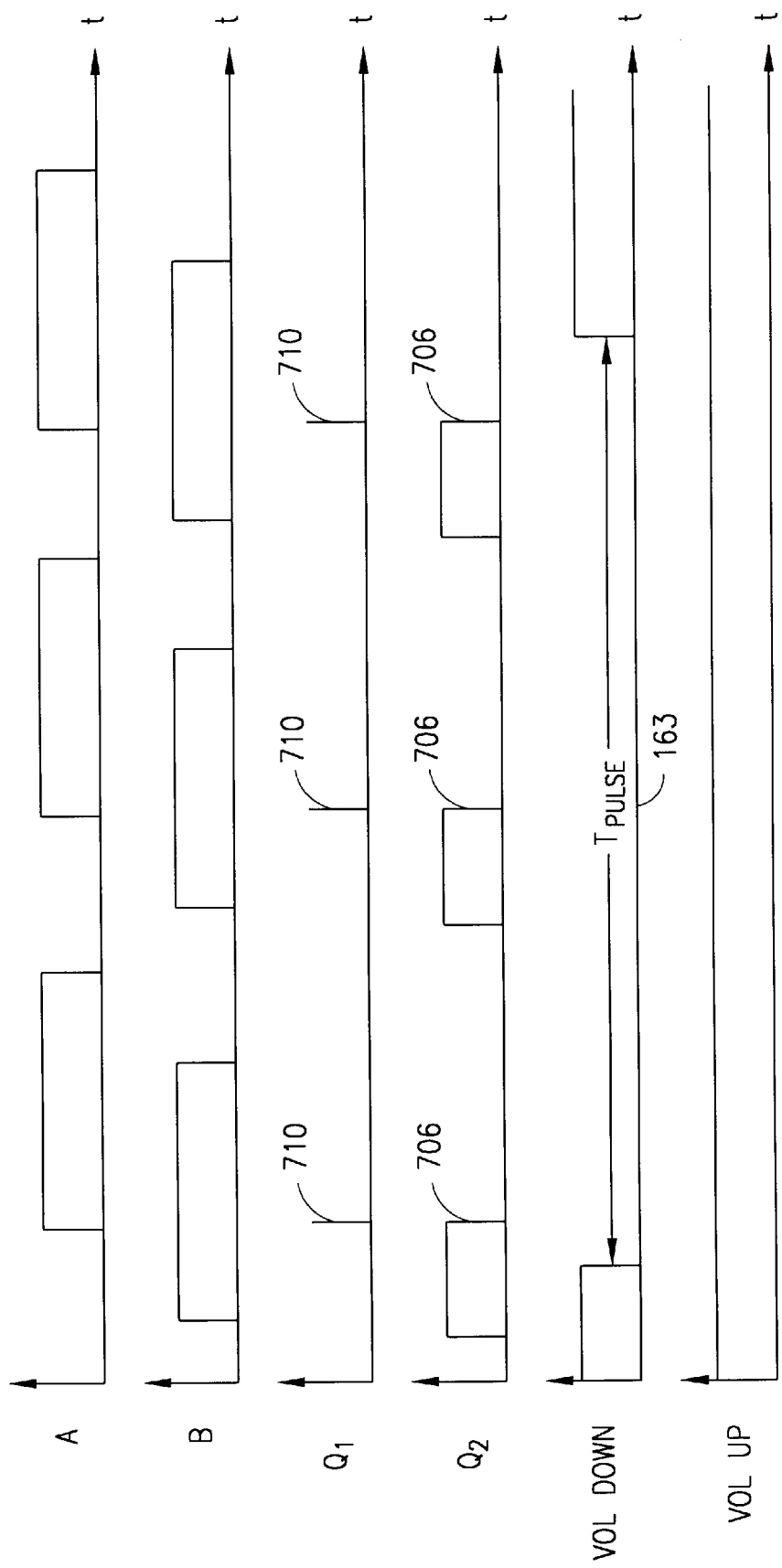

In another embodiment, as shown in FIG. 14, the volume encoder circuit 150 may be replaced with another volume encoder circuit 700, and the mute button 14 may directly control the down pulse of the mute sequence 175. A logic circuit 702 generates two signals Q1 and Q2, internal to the circuit 700, which indicate rotation of the knob 16 and the direction of the rotation. When the signal Q2 is pulsed high 704 (FIG. 15), the knob 16 is rotating in a clockwise direction. When the signal Q1 is pulsed high 706 (FIG. 16), the knob 16 is rotating in a counterclockwise direction.

For purposes of generating the down pulse 160 of the volume up sequence 171 (via the signal VOLUP#), the signal Q1 is received by a timer circuit 414 which inverts and extends the duration of the pulse 704 to form the down pulse 160 (of duration $T_{PULSE}$). For purposes of generating the down pulse 163 of the volume down sequence 173 (via the signal VOLDOWN#), the signal Q2 is received by a timer circuit 436 which inverts and extends the duration of the pulse 706 to form the down pulse 163 (of duration $T_{PULSE}$). Spikes 708 present in the signal Q2 during clockwise rotation of the knob 16 are not of sufficient duration to initiate a response by the timer 436. Similarly, spikes 710 present in the signal Q1 during the counterclockwise rotation of the knob 16 are not of sufficient duration to initiate a response by the timer 414. Unlike the volume encoder circuit 150, the volume encoder circuit 700 neither queues incremental angular displacements 710 nor regulates the duration of the deassertion of the signals VOLUP# and VOLDOWN# after the down pulses 160 and 163.

For purposes of generating the mute sequence 175, the signals VOLUP# and VOLDOWN# are both connected via diodes 419 and 421, respectively, to one terminal of the series switched path 155 of the mute button 14. The other terminal of the series switched path 155 is connected to ground. Therefore, when the mute button 14 is depressed, both signals VOLUP# and VOLDOWN# are asserted, or driven low.

The anode of the diodes 419 and 421 are both connected to one terminal of the path 155. The cathodes of the diodes 419 and 421 are connected to the signals VOLUP# and VOLDOWN#, respectively. The signals VOLUP# and VOLDOWN# are coupled to a DC voltage supply level via pull-up resistors 411 and 415, respectively. A filtering capacitance (capacitors 413 and 417) are coupled between the supply voltage level and ground.

The volume encoder circuit 700 includes a D-type flip-flop 402 which has its signal input pulled to a DC voltage supply level and has its clock input receiving the signal A. A pull-up resistor 446 couples the signal A to the voltage supply level. The clear input of the flip-flop 402 is coupled to the output of an AND gate 400 which receives a system reset signal RST# (asserted, or driven low, to indicate reset of the system 10) at an inverted input and the output of a NAND gate 420. One input of the NAND gate 420 is connected to the non-inverting output of the flip-flop 402, and the other input of the NAND gate 420 is connected to the non-inverting output of a D-type flip-flop 404. The clock input of the flip-flop 404 receives the signal B, and the signal input of the flip-flop 404 is connected to the DC voltage supply level. A pull-up resistor 406 couples the signal B to the DC voltage supply level, and the clear input of the flip-flop 404 is connected to the output of the AND gate 400. The non-inverting output of the flip-flop 402 passes through a low pass filter (a resistor 444 and a capacitor 442) to form the signal Q1. The non-inverting output of the flip-flop 404 passes through a low pass filter (a resistor 408 and a capacitor 410) to form the signal Q2. The clear input of the timer circuit 414 receives a signal RST (the inverted RST# signal) and the output of the timer circuit 414 is coupled to the base of a bipolar NPN transistor 432 via a series resistor 430. The emitter of the transistor 432 is connected to ground, and the collector of the transistor 432 furnishes the signal VOLUP#. The clear input of the timer circuit 436 receives the signal RST, and the output of the timer circuit 436 is coupled to the base of a bipolar NPN transistor 418 via a series resistor 416. The emitter of the transistor 418 is connected to ground, and the collector of the transistor 418 furnishes the signal VOLDOWN#.

Other embodiments are within the scope of the following claims. For example, although the control of a volume level of sound has been discussed, other audible characteristics of sound may be controlled, such as a frequency characteristic or balance. Furthermore, aspects of multimedia may be controlled other than audio. For example, the control techniques discussed may be applied to control characteristics (e.g., color palette) of images displayed on the monitor (generated by a video controller). As another example, the speed of a video image replayed from a CD-ROM may be controlled using these same techniques.

APPENDIX A

Voltemp

```
#crossref
#noformfeed
#noheadings
            .TITLE   volume, 'ORCA Volume Control Program'
            .LIST    X'FF                  ;complete listing
            ;Author: Alp Bayramoglu
            ;Company: Compaq Computer Corporation
            ;
            PORTLD=0D0                     ;PORT L DATA
            PORTLC=0D1                     ;PORT L CONFIG
            PORTLP=0D2                     ;PORT L PIN
            ;
            PORTGD=0D4                     ;PORT G DATA
            PORTGC=0D5                     ;PORT G CONFIG
            PORTGP=0DE                     ;PORT G PIN
            ;
            TMRLO=0EA                      ;TIMER LOW BYTE
            TMRHI=0EB                      ;TIMER HIGH BYTE
            TAULO=0EC                      ;TIMER REGISTER LOW BYTE
            TAUHI=0ED                      ;TIMER REGISTER HIGH BYTE
            ;
            CNTRL=0EE                      ;CONTROL REGISTER
            PSW=0EF                        ;PSW REGISTER
            ;VARIABLES
            UPCOUNT=000
            DOWNCOUNT=001
```

APPENDIX A-continued

Voltemp

```
                UPVALUE=002
                DOWNVALUE=003
                ALLONE=004
                ONE=005
                ZERO=006
                TEMP=007
                MUTEUP=008
                POWERCOND=009
                POWERSTAT=010
                POWERMSB=011
                POWERLSB=012
                PTEMPMSB=013
                PTEMPLSB=014
                IPND= 3
                ENTI= 4
                TPND= 5
                GIE= 0
                .CHIP   860C            ; (doesn't really matter which)
;               .MAXROM X'0FFF
;========================================================================
;
;========================================================================
;               .INCLD VOLTEMP.INC      ;Equates, Variables
;========================================================================
                .SECT   code,ROM
reset:          LD      SP,#X'2F        ;(make it work on all COF8 parts)
                                        ;start: LD trpcnt,#X'FF
                LD      PORTLC,#0F0     ;HI-Z INPUTS FOR L0,L1,L2,L3 was 0fc
                LD      FORTLD,#00F     ;WEAK PULLUP FOR L0–L2
                LD      PORTGC,#000
                LD      FORTGD,#03F
                LD      CNTRL,#080      ;10000000 AUTORELOAD
                LD      PSW,#013        ;ENABLE EXTERNAL AND TIMER INT
                LD      TMRLO,#000      ;TIMER LOW BYTE
                LD      TMRHI,#054      ;TIMER HIGH BYTE
                LD      TAULO,#000      ;TIMER AUTOLCAD
                LD      TAUHI,#054      ;timer autoload 38H=42 msec
                                        ;with 3 usec clock
                LD      UFCOUNT,#00
                LD      DOWNCOUNT,#00
                LD      UPVALUE,#001
                LD      DOWNVALUE,#001
                LD      ALLONE,#0FF
                LD      ONE,#001
                LD      ZERO,#000
                LD      MUTEUF,#078
                LD      POWERMSB,#001
                LD      POWERLSB,#000
                LD      POWERCOND,#010
                LD      A,POWERCOND
                X       A,PORTLD
WAIT:           LD      A,PORTLP        ;CHECK THE MUTE BUTTON
                AND     A,#004          ;MASK OTHER INPUTS
                IFEQ    A,#004          ;IF THE MUTE BUTTON IS PRESSED
                JMP     MUTECHECK
;               LD      A,PORTLP
;               AND     A,#008
;               IFEQ    A,#008
;               JMP     POWERCHK
                LD      MUTEUP,#034
;               LD      POWERSTAT,#034
                NOP
                JF      WAIT            ;LOOP
MUTECHECK:      LD      A,#0FF          ;DEBOUNCE THE MUTE BUTTON
MUTECHECK1:     DEC     A
                IFEQ    A,#000
                JP      MOVEON
                JP      MUTECHECK1
MOVEON:         LD      A,PORTLP
                AND     A,#004
                IFEQ    A,#004
                JMP     MUTEIT
                JMP     WAIT
MUTEIT:         LD      A,MUTEUP
                IFEQ    A,#034
                JP      MUTE
                JMP     WAIT
```

APPENDIX A-continued

Voltemp

```
MUTE:       LD     PSW,#000            ;DISABLE INTERRUPTS
            LD     A,#0C0              ;PREPARE HIGH OUTPUT FOR HI AND LOW
            X      A,PORTLD            ;OUTPUT UP=1(L7) DOWN=1(L6)
            LD     A,#048              ;LOAD THE COUNT FOR PULSE WIDTH
            X      A,TEMP              ;STORE THE COUNT
OUTER:      LD     A,TEMP              ;LOAD THE PREVIOUS COUNT
            DEC    A                   ;DECREMENT BY ONE
            IFEQ   A,ZERO              ;CHECK IF THE COUNT IS ZERO
            JP     MUTEOUT             ;YES THEN PUTPUT ZERO
            X      A,TEMP              ;NO THEN PLACE THE COUNT IN TEEMP
            LD     A,#058
INNER:      DEC    A                   ;DECREMENT BY ONE
            IFEQ   A,ZERO              ;CHECK IF INNER LOOP REACHED ZERO
            JP     OUTER               ;IF YES THEN GO BACK TO OUTER LOOP
            JP     INNER               ;IF NO THEN DO INNER LOOP AGAIN
MUTEOUT:    LD     A,#000              ;ZERO BOTH UP AND DOWN OUTPUT
            X      A,PORTLD            ;OUTPUT THE ZERO VALUES
            LD     MUTEUP,#078
            LD     PSW,#013            ;ENABLE INTERRUPTS
            JMP    WAIT                ;GO BACK TO IDLE STATE
;POWERCHK:  LD     A,POWERMSB
;           X      A,PTEMPMSB
;POUTER:    LD     A,PTEMPMSB
;           DEC    A
;           IFEQ   A,#000
;           JP     POWERGO
;           X      A,PTEMFMSB
;           LD     A,POWERLSB
;PINNER:    LD     A,PTEMPLSB
;           DEC    A
;           IFEQ   A,#000
;           JP     POUTER
;           X      A,PTEMPLSB
;           JP     PINNER
;POWERGO:   LD     A,PORTLP
;           AND    A,#008
;           IFEQ   A,#008
;           JMP    POWERIT
;           JMP    WAIT
;POWERIT:   LD     A,POWERSTAT
;           IFEQ   A,#034
;           JP     POWERUP
;           JMP    WAIT
;POWERUP:   LD     A,POWERCOND
;           IFEQ   A,#010
;           LD     POWERCOND,#020
;           IFEQ   A,#020
;           LD     POWERCOND,#010
;           LD     A,POWERCOND
;           XD     A,PORTLD
;           X      POWERSTAT,#078
;           JMP    WAIT
            .=00FFH
            IFBIT  TPND,PSW            ;IS IT TIMER INTERRUPT
            JMP    TMRINT              ;YES GO TO TIMER ROUTINE
            IFBIT  IPND,PSW            ;IS IT EXTERNAL INTERRUPT?
            JMP    EXTINT              ;YES GO TO EXTERNAL ROUTINE
            RETI                       ;ELSE GO BACK TO LOOP
EXTINT:     RBIT   IPND,PSW            ;RESET THE INTERRUPT BIT
            LD     A,PORTLP            ; check input b AT L1
            RRC    A                   ; ROTATE A TO RIGHT
            AND    A,#001              ; CHECK TO SEE IF IT IS 1
            IFEQ   A,ONE               ; IF b=1 then direction is down
            JMP    DOWNPULSE
UPPULSE:    LD     A,UPCOUNT           ;LOAD THE COUNT IN A
            INC    A                   ;COUNT THE INPUT PULSE
            X      A,UPCOUNT           ;STORE THE COUNT IN MEMORY
            LD     A,UPCOUNT
            IFGT   A,#002
            JP     ZRDN
            LD     PSW,#012            ;ENABLE EXTERNAL AND TIMER INT
            LD     CNTRL,#090
            RETI                       ;LOOP
ZRDN:       LD     A,DOWNCOUNT         ;ZERO DOWNCOUNTER
            XOR    A,DOWNCOUNT
            X      A,DCWNCOUNT
            LD     PSW,#012            ;ENABLE EXTERNAL AND TIMER INT
```

APPENDIX A-continued

Voltemp

```
             LD     CNTRL,#090
             RETI                   ;LOOP
DOWNPULSE:   LD     A,DOWNCOUNT
             INC    A
             X      A,DOWNCOUNT     ;STORE THE DOWN COUNT
             LD     A,DOWNCOUNT
             IFGT   A,#002
             JP     ZRUP
             LD     PSW,#012        ;ENABLE EXTERNAL AND TIMER INT
             LD     CNTRL,#090
             RETI                   ;LOOP
ZRUP:        LD     A,UPCOUNT       ;ZERO UPCOUNTER
             XOR    A,UPCOUNT
             X      A,UPCOUNT
             LD     PSW,#012        ;ENABLE EXTERNAL AND TIMER INT
             LD     CNTRL,#090
             RETI                   ;LOOP
TMRINT:      RBIT   TPND,PSW        ;RESET TIMER INTERRUPT BIT
             LD     A,UPCOUNT       ;CHECK THE NUMBER OF UP PULSES
             IFEQ   A,ZERO          ;AND JUMP TO DOWN ROUTINE IF
             JMP    DOWNCHECK       ;ZERO
UPOUT:       LD     A,UPVALUE       ;GET THE PREVIOUS OUTPUT
             RRC    A
             RRC    A               ;L7 IS UP OUTPUT
             AND    A,#080          ;MASK THE OUTPUT UP=A DOWN=/A
             X      A,PORTLD        ;OUTPUT THE PULSE
             LD     A,UPVALUE
             IFEQ   A,ONE           ;IF PREVIOUS OUTPUT IS ONE
             JP     GOONUP          ;THEN DO NOT DECREMENT UP PULSES COUNT
             LD     A,UPCOUNT       ;ELSE DECREMENT THE COUNT BY ONE
             DEC    A               ;THIS CORRESPONDS THE DOWN PULSE OF
             X      A,UPCOUNT       ;THE UP VOLUME CYCLE
GOONUP:      LD     A,ALLONE        ;A=11111111
             XOR    A,UPVALUE       ;FLIP THE OUTPUT
             X      A,UPVALUE       ;STORE THE FLIPPED VALUE
             LD     PSW,#012        ;ENABLE EXTERNAL AND TIMER INT
             RETI                   ;RETURN TO MAIN ROUTINE
DOWNCHECK:   LD     A,DOWNCOUNT     ;CHECK THE NUMBER OF DOWN PULSES
             IFEQ   A,ZERO          ;AND JUMP TO WAIT ROUTINE IF
             JMP    RETURN          ;ZERO
DOWNOUT:     LD     A,DOWNVALUE
             RRC    A
             RRC    A
             RRC    A
             AND    A,#040          ;L6 IS DOWN OUTPUT
             X      A,PORTLD        ;OUTPUT THE PULSE
             LD     A,DOWNVALUE
             IFEQ   A,ONE
             JP     GOONDN
             LD     A,DOWNCOUNT
             DEC    A
             X      A,DOWNCOUNT
GOONDN:      LD     A,ALLONE        ;A=11111111
             XOR    A,DOWNVALUE     ;FLIP THE OUTPUT
             X      A,DOWNVALUE
RETURN:      LD     PSW,#012        ;ENABLE EXTERNAL AND TIMER INT
             RETI                   ;RETURN TO MAIN ROUTINE
             END    reset
```

COPYRIGHT 1996 BY COMPAQ COMPUTER CORPORATION

What is claimed is:

1. A computer system having a central processing unit, comprising:

a sound generating device;

a display device;

a volume control circuit coupled to a volume control knob, said volume control circuit including a shaft encoder and volume encoder circuit coupled thereto, said volume control knob rotatable in either direction with a set of pre-determined discrete angular displacement increments configured to permit a user to indicate a desired setting of a characteristic of a sound signal to be generated by said sound generating device, said volume control circuit for providing a first set of signals that are indicative of said characteristic;

a multiple line video cable having lines connecting said volume control circuit with a decoder circuit, said decoder circuit for generating a second set of signals based on said first set of signals; and sound circuitry configured to communicate with said central processing unit, said sound circuitry connected to receive said second set of signals under the control of said central processing unit, said sound circuitry for producing audio signals in response thereto, said audio signals for driving said sound generating device.

2. The computer system as set forth in claim 1, wherein said sound generating device comprises a speaker.

3. The computer system as set forth in claim 1, wherein said characteristic comprises a volume level associated with said sound signal.

4. The computer system as set forth in claim 1, wherein said volume control knob comprises a manually rotatable element coupled to said shaft encoder.

5. The computer system as set forth in claim 4, wherein said manually rotatable element is rotatable without stopping in either direction.

6. The computer system as set forth in claim 1, wherein said multiple line video cable comprises a VGA cable and said display device comprises a VGA-compatible monitor.

7. A computer system comprising:

a video display device;

a video controller;

a feature generating device; and an apparatus for controlling a level of a perceptible characteristic of a feature of a multimedia presentation that is presented by said feature generating device, said apparatus comprising:

a volume control circuit coupled to a volume control knob, which knob is rotatable in either direction with a set of pre-determined discrete angular displacement increments configured to permit a user to indicate a desired level of said perceptible characteristic, said volume control circuit including a shaft encoder and a volume encoder coupled thereto;

a multiple line video cable having lines, at least one of said lines for connecting said video controller with said video display device; and feature circuitry having a feature output connected to deliver feature signals to drive said feature generating device, said feature circuitry connected at one end of at least one line of said multiple line video cable, designated as a feature line, wherein said feature line is coupled at the other end to said volume control circuit to enable said volume control circuit to communicate with said feature circuitry.

8. The computer system as set forth in claim 7, wherein said perceptible characteristic comprises a volume level associated with said multimedia presentation.

9. The computer system as set forth in claim 7, wherein said multiple line video cable comprises a VGA cable and said video display device comprises a VGA-compatible monitor.

10. The computer system as set forth in claim 7, wherein said feature generating device comprises a speaker.

* * * * *